(12) United States Patent
Matsuda et al.

(10) Patent No.: US 6,969,557 B2
(45) Date of Patent: Nov. 29, 2005

(54) SURFACE-TREATED COPPER FOIL LOW-DIELECTRIC SUBSTRATE AND COPPER-CLAD LAMINATE AND PRINTED WIRING BOARD USING THE SAME

(75) Inventors: Mitsuyoshi Matsuda, Ageo (JP); Takashi Kataoka, Ageo (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 0 days.

(21) Appl. No.: 10/485,353

(22) PCT Filed: Jun. 3, 2003

(86) PCT No.: PCT/JP03/07007

§ 371 (c)(1),
(2), (4) Date: Jan. 30, 2004

(87) PCT Pub. No.: WO03/102277

PCT Pub. Date: Dec. 11, 2003

(65) Prior Publication Data

US 2004/0191560 A1 Sep. 30, 2004

(30) Foreign Application Priority Data

Jun. 4, 2002 (JP) ........................................ 2002-163639

(51) Int. Cl.[7] ................................................ B32B 5/20
(52) U.S. Cl. ....................... 428/546; 428/612; 428/648; 428/658; 428/674; 428/935
(58) Field of Search .................................. 428/607, 344, 428/472

(56) References Cited

U.S. PATENT DOCUMENTS

| 5,366,814 | A | * | 11/1994 | Yamanishi et al. | ......... 428/607 |
| 5,389,446 | A | * | 2/1995 | Yamanishi et al. | ......... 428/472 |
| 5,622,782 | A | * | 4/1997 | Poutasse et al. | ............ 428/344 |
| 5,861,076 | A | * | 1/1999 | Adlam et al. | ................ 156/281 |
| 6,605,369 | B1 | * | 8/2003 | Takahashi et al. | .......... 428/623 |

FOREIGN PATENT DOCUMENTS

| JP | 5-29740 A | 2/1993 |
| JP | 06-256966 A | 9/1994 |
| JP | 11-340596 A | 12/1999 |
| JP | 11-354901 A | 12/1999 |
| WO | WO 01/45475 A1 | 5/2001 |
| WO | WO 01/56342 A1 | 8/2001 |
| WO | WO 01/56343 A1 | 8/2001 |
| WO | WO 01/56344 A1 | 8/2001 |
| WO | WO 01/56345 A1 | 8/2001 |
| WO | WO 03/015483 A1 | 2/2003 |

* cited by examiner

Primary Examiner—Cathy F. Lam
(74) Attorney, Agent, or Firm—Rothwell, Figg, Ernst & Manbeck, P.C.

(57) ABSTRACT

The invention provides a surface-treated copper foil which can sufficiently ensure adhesive strength with a low-dielectric substrate used in forming a printed wiring board for high-frequency applications and can minimize transmission losses. There is provided a surface-treated copper foil for a low-dielectric substrate which is used in bonded relationship to a low-dielectric substrate, which is characterized in that a nodular-treated layer constituted by bump-like copper particles is formed on a surface of the copper foil and that ultrafine copper particles are caused to precipitate on the whole surface of the nodular-treated layer and adhere thereto and the roughness value Rz of the surface is 1.0 to 6.5 $\mu$m. The surface color of the surface-treated copper foil has $L^*$ of not more than 50, $a^*$ of not more than 20 and $b^*$ of not more than 15. A passivated layer containing at least one kind selected from the group consisting of zinc and nickel is provided on surfaces of the ultrafine copper particles which are caused to precipitate on the whole of the surfaces of the bump-like copper particles of the nodular-treated layer and adhere thereto.

17 Claims, 3 Drawing Sheets

SURFACE-TREATED COPPER FOIL LOW-DIELECTRIC SUBSTRATE AND COPPER-CLAD LAMINATE AND PRINTED WIRING BOARD USING THE SAME

CROSS REFERENCE TO RELATED APPLICATION

This application is a 35 USC § 371 National Phase Entry Application from PCT/JP03/07007, filed Jun. 3, 2003, and designating the U.S.

TECHNICAL FIELD

The present invention relates to a surface-treated copper foil for a printed wiring board and, more particularly, to a surface-treated copper foil suitable for constituting a printed wiring board using a low-dielectric substrate that is compatible with high-frequency signals.

BACKGROUND ART

In recent years, owing to-dramatic progress in information and communication technology, the Internet has changed from a simple medium for retrieving information from media for supplying and receiving various types of information and services. In association with this change, requests for a more comfortable environment, i.e., requirements for "larger quantities of information at higher speeds, in a more real manner" have become strong. In order to realize this comfortable environment (of the Internet), it is necessary to send and receive a large amount of information in a short time and high-speed design of signals, i.e., high-frequency design of signals becomes indispensable.

A printed wiring board used in a substrate which handles the high-frequency signals requires techniques for minimizing transmission losses in order to keep and ensure the quality of the signals. The transmission losses can be divided into the three factors of conductor losses, dielectric losses and radiation losses. When the factors of the transmission losses are viewed from the standpoint of copper foil which constitutes conductor circuits of a printed wiring board, the following can be considered.

First, conductor losses will be described. In the case of high-frequency design of signals, the skin resistance of a conductor circuit increases and conductor losses increase. In a high-frequency signal, the skin effect phenomenon occurs, that is, when an alternating current is caused to flow in a conductor circuit, back electromotive force is generated in the central part of the conductor circuit due to a magnetic flux change and the current becomes less apt to flow, with the result that the phenomenon that the current flows in the surface portion of the conductor occurs. For this reason, the effective sectional area where the current flows in the conductor circuit decreases and resistance increases. This is called skin resistance. The skin portion where the current flows in the conductor circuit is called the skin depth and it is considered that this skin depth decreases inversely proportional to the square root of a frequency.

When an investigation was made into the skin depth and skin resistance of a conductor circuit at each frequency from the relationship between this skin resistance, skin depth and frequency, it became apparent that the skin depth becomes not more than 2 μm when a signal frequency becomes that of the GHz zone and that a high-frequency signal flows only in the surface layer and skin portion of the conductor circuit. Furthermore, when transmission losses were investigated by forming conductor circuits from copper foil having different surface shapes of a conductor circuit, i.e., different shapes (roughness) of a surface bonded to the substrate, transmission losses showed a tendency to increase when a conductor circuit is formed from copper foil having large roughness of the bonded surface. This is due to the skin effect of the conductor circuit and it might be thought that this is because the propagation distance of a signal becomes long in copper foil having high bonded surface roughness. From this, it might be thought that copper foil having low bonded surface roughness, i.e., low-profile copper foil is effective as the copper foil used in forming a printed wiring board for high-frequency applications.

Next, dielectric losses will be described. Dielectric losses are determined by the dielectric constant and dielectric dissipation factor of a substrate resin. When a pulse signal is caused to flow in a conductor circuit, a change occurs in an electric field around the conductor circuit. A delay in the electric field change occurs when the cycle of the change (frequency) of an electric field approaches the relaxation time of the polarization of the substrate resin (the travel time of a charged body which polarizes). And when such a state is produced, molecular friction occurs within the resin and heat is generated, resulting in losses. For this reason, in a resin used for high-frequency signals, substituents of large polarity are minimized or brought into the state of null in order to cause the above-described polarization by an electric field change to occur less easily. Incidentally, in this specification a substrate having low-dielectric constant properties in which such substituents of large polarity are minimized or brought into the state of null or a substrate having low dielectric dissipation factor properties is called a low-dielectric substrate.

Incidentally, such substituents of large polarity contribute greatly to the chemical adhesion between a substrate resin and copper foil. Therefore, in a low-dielectric substrate formed from a resin in which substituents of large polarity are minimized (or brought into the state of null) in order to lower the dielectric constant and the dielectric dissipation factor, the adhesion to the copper foil is not good and hence the peel strength of a conductor circuit tends to become very low. A comparison of peel strength between the conventionally used FR-4 substrate and a low-dielectric substrate reveals that in the FR-4 substrate, an cohesive failure (the state in which the bond is fractured at the interface within the substrate resin) occurs during peeling and high peel strength is obtained, whereas in a low-dielectric substrate, an interfacial failure (the state in which the bond is fractured between the copper foil and the substrate resin) occurs and only low peel strength is obtained. When the peel strength is low, there is a possibility that circuit peeling during the manufacturing process of a printed wiring board and the falling-off of mounted parts in the outermost layer may occur and this is undesirable.

In order to reduce the dielectric losses, it is possible to cope with a decrease in the peel strength, which occurs when a low-dielectric substrate is used, by devising copper foil. That is, it is possible to improve the peel strength by increasing the bonded surface roughness of the copper foil. However, when the bonded surface roughness of the copper foil is increased, the effect on conductor losses increases as described above although the problem of the peel strength in a low-dielectric substrate can be solved.

DISCLOSURE OF THE INVENTION

The present invention was made against the background of a situation as described above. The invention has as its object the provision of surface-treated copper foil which can sufficiently ensure the adhesive strength with a low-dielectric substrate used in forming a printed wiring board for high-frequency applications and can minimize transmission losses.

In order to carry out the above-described task, with the suppression of transmission losses in a low-dielectric substrate in high-frequency applications in mind, the present inventors examined copper foil in which the adhesive strength with a substrate is improved. As a result, the invention provides surface-treated copper foil for a low-dielectric substrate which is used in bonded relationship to a low-dielectric substrate, which is characterized in that a nodular-treated layer constituted by bump-like copper particles is formed on a surface of the copper foil and that ultrafine copper particles are caused to precipitate on the whole surface of the nodular-treated layer and adhere thereto and the roughness value Rz of the surface is 1.0 to 6.5 μm.

According to the surface-treated copper foil for a low-dielectric substrate related to the invention, it is possible to realize high adhesive strength because positive bonding is ensured also with a low-dielectric substrate. That is, when a low-dielectric substrate and the surface-treated copper foil related to the invention are bonded together, the copper foil does not easily peel off from the bonding interface. When the surface-treated copper foil for a low-dielectric substrate related to the invention is peeled from the substrate, a fracture phenomenon occurs within the resin of the substrate and a phenomenon what is called the cohesive failure occurs, resulting in high peel strength.

A nodular-treated layer in the surface-treated copper foil for a low-dielectric substrate related to the invention is formed by forming copper microparticles on the surface of the copper foil under the burn plating conditions and by performing seal plating to prevent the falling-off of the copper microparticles. The "seal plating" called here refers to plating treatment for precipitating copper in a uniform state. In this nodular-treated layer, a large number of bump-like copper particles having a particle size of 0.5 to 3.0 μm are present on the copper foil surface.

And in the surface-treated copper foil for a low-dielectric substrate related to the invention, ultrafine copper particles are caused to precipitate on the bump-like copper particles of this nodular-treated layer and adhere thereto all over the surface of the nodular-treated layer. The ultrafine copper particles refer to very fine copper particles (particle size: 0.1 to 1.0 μm) and their shapes, which are not especially limited, include what is called spherical ones and acicular one which are called "whiskers plating" by those skilled in the art. For example, it is possible to form ultrafine copper particles by using also a copper electrolyte to which benzoquinolines, which can precipitate and adhere by use of an arsenic-containing electrolyte and have a low possibility of affecting the human body, are added in consideration of the environmental aspect. When such ultrafine copper particles precipitate uniformly on the surfaces of each of the bump-like copper particles and are caused to precipitate on the whole nodular-treated surface and adhere thereto, fine concave and convex shapes are given to the surfaces of the bump-like copper particles as a whole, with the result that it is possible to increase the adhesion to the substrate at a very high level. The minimum level of L* is −50 and on the minus side of this value, the falling-off phenomenon of ultrafine copper particles which is referred to as what is called powdering becomes apt to occur and the phenomenon that copper particles remain on the substrate surface when the surface-treated copper foil bonded to the substrate is peeled, which is referred to as what is called transfer, becomes apt to occur. Furthermore, the minimum value of a* and b* is 0 because the surface-treated copper foil obtains a color tint which seems to be a reddish copper color.

It is preferred that in the surface-treated copper foil for a low-dielectric substrate related to the invention, the surface color of the surface-treated copper foil on the side where the surface-treated copper foil is bonded to the low-dielectric substrate has L* of not more than 50, a* of not more than 20 and b* of not more than 15. When the surface color of the surface-treated copper foil for a low-dielectric substrate related to the invention is identified in accordance with the L* a* b* (el star, ei star, bi star) color system defined in JIS Z 8729, the bonded surface has such a color. If a bonded surface has this surface color, it is possible to more positively improve adhesive strength to a low-dielectric substrate. Furthermore, when ultrafine copper particles are caused to precipitate on the copper foil surface and adhere thereto as in the present invention, a color tint which is reddish and seems to be what is called the copper color tends to disappear.

In developing the surface-treated copper foil for a low-dielectric substrate related to the invention, the present inventors recognized that there is a tendency in the transmission characteristics as described below. As described earlier, when a signal frequency becomes that of the GHz zone, this high-frequency signal flows only in the surface layer and skin portion of the conductor circuit, and transmission losses tend to increase when the shape (roughness) of the bonded surface of the copper foil with the substrate becomes rough. Therefore, the present inventors investigated the relationship between the surface shape of the bonded surface, i.e., the nodular-treated layer in surface-treated copper foil and the transmission characteristics and found out that the occurrence condition of bump-like copper particles with a particle size of 0.5 to 3.0 μm which constitute the nodular-treated layer has an effect on the transmission characteristics. More concretely, the transmission characteristics tended to become worse when the density of the bump-like copper particles which constitute the nodular-treated layer was extremely increased. The correlation between the occurrence condition of the bump-like copper particles, for example, the value of distribution density of the bump-like copper particles and the transmission characteristics has not been clarified. However, the present inventors have ascertained that by appropriately controlling the density of the bump-like copper particles constituting the nodular-treated layer, it is possible to realize surface-treated copper foil for a low-dielectric substrate which does not impair the transmission characteristics.

Furthermore, in the surface-treated copper foil for a low-dielectric substrate related to the invention, it is preferred that a passivated layer containing at least one kind selected from the group consisting of zinc and nickel be provided on surfaces of the ultrafine copper particles which are caused to precipitate on the whole of the surfaces of the bump-like copper particles of the nodular-treated layer and adhere thereto. In this case, the composition of zinc and nickel can determine an optimum passivated layer according to the characteristics of various types of low-dielectric substrates.

According to a study by the present inventors, it has been ascertained that in the surface-treated copper foil for a low-dielectric substrate related to the invention, in a case where a passivated layer of zinc and nickel is formed, the total deposited amount of nickel and zinc is preferably 20 to 60 mg/m$^2$. If this passivated layer of nickel and zinc is formed beforehand, the copper foil does not easily peel off from the bonded interface obtained by the bonding to a low-dielectric substrate and the passivated layer provides excellent chemical resistance, humidity resistance or solder heat resistance. Basically, the higher the nickel content, the better peel strength, chemical resistance, humidity resistance and solder heat resistance, and chemical resistance and solder heat resistance tend to deteriorate with increasing zinc content. For this reason, when a passivated layer of nickel and zinc is formed, it is preferred from a practical standpoint that when the total deposited amount of nickel and zinc is 20 to 60 mg/m$^2$, the passivated layer contains nickel and zinc at a ratio of nickel to zinc in the range of 6:4 to 8:2. When the nickel ratio exceeds 80%, an etching residue tends to be formed during circuit formation. Also, when the zinc ratio exceeds 40%, chemical resistance and solder heat resistance deteriorate, making the copper clad impracticable.

Also, the present inventors have ascertained that in this passivated layer, the deposited amounts of nickel and zinc are apt to change depending on the treatment condition of the above-described ultrafine copper particles. That is, in the case of a surface which is treated to provide a large number of ultrafine copper particles, when the passivation with nickel and zinc is actually performed, nickel and zinc are apt to be deposited in amounts larger than planned deposited amounts. Therefore, in forming a passivated layer, it is necessary to determine the passivation conditions of nickel and/or zinc by beforehand considering the treatment condition of ultrafine copper particles. Furthermore, although in the surface-treated copper foil for a low-dielectric substrate related to the invention, the nodular-treated layer demands bump-like copper particles having a particle size of 0.5 to 3.0 $\mu$m and ultrafine copper particles having a particle size of 0.1 to 1.0 $\mu$m as essential requirements, the present authors have ascertained that even when the nodular-treated layer has only bump-like copper particles (that is, the treatment to form ultrafine copper particles is not performed), the adhesion to a low-dielectric substrate can be ensured to a certain degree by forming the above-described passivated layer of nickel and/or zinc on a nodular-treated layer which is not subjected to the treatment to form ultrafine copper particles.

In the surface-treated copper foil for a low-dielectric substrate-related to the invention, it is preferred that a chromate layer be formed on the passivated layer containing at least one kind selected from the group consisting of zinc and nickel and that a silane coupling agent-adsorbed layer in which a silane coupling agent is adsorbed on the surface of the chromate layer be formed. The chromate layer and the silane coupling agent-adsorbed layer can further improve humidity resistance and chemical resistance and can further improve the adhesion to a low-dielectric substrate.

In this case, the types of silane coupling agent are not especially limited and it is possible to use, for example, vinyl trimethoxysilane, vinyl phenyl trimethoxysilane, γ-glycidoxypropyltrimethoxysilane, 4-glycidylbutyl trimethoxysilane, imidazolesilane, triazinesilane and γ-mercaptopropyltrimethoxysilane. Furthermore, according to a study by the present inventors, it has been also ascertained that amino functional silanes and acrylic silanes are suitable for a low-dielectric substrate. For example, it is possible to enumerate γ-aminopropyltriethoxysilane, N-β (aminoethyl) γ-aminopropyltrimethoxysilane, N-3-(4-(3-aminopropoxy) ptoxy) propyl-3-aminopropyltrimethoxysilane, γ-methacryloxypropyltrimethoxysilane, γ-acryloxypropylmethoxysilane, etc.

In the surface-treated copper foil for a low-dielectric substrate related to the invention, it is preferred that copper foil be formed by causing copper to precipitate on a cathode by the electrolysis of copper and that a copper foil surface which is opposed to the cathode upon peeling of the copper foil from the cathode be subjected to surface treatment. Usually, copper foil manufactured by electrolysis is obtained by dipping a cathode in a copper sulfate electrolyte. In the case of a continuous manufacturing method, a drum-shaped rotary cathode is dipped in a copper sulfate electrolyte, copper is caused to precipitate on the cathode surface by an electrolytic reaction to form copper foil, and the copper foil is peeled from the cathode surface. In such electrodeposited copper foil, the side on which electrodeposition is started in the initial stage of electrodeposition on the cathode surface is called the shiny side and the side reverse to this shiny side where the electrolysis is finished is called the matte side to make a distinction. The shiny side is a smooth surface which provides a transfer configuration of the cathode surface and the matte surface provides an "unfinished" surface having irregularities. When surface-treated copper foil of low roughness is to be obtained as in the present invention, this surface-treated copper foil can be easily formed by subjecting this shiny side to the above-described surface treatment.

Incidentally, as a matter of course, it is possible to use rolled copper foil in which two sides are in a smooth condition in place of electrodeposited copper foil.

Furthermore, the surface-treated copper foil for a low-dielectric substrate related to the invention can also be applied to a case where copper foil is formed by causing copper to precipitate on a cathode by the electrolysis of copper and a copper foil surface on the finishing side of the electrolysis of the copper foil is subjected to surface treatment. That is, it is possible to obtain copper foil having high peel strength usually by subjecting a matte side which is reverse to the shiny side of the above-described copper foil, i.e., the copper foil surface which is used as the bonded surface to surface treatment. When the matte side of copper foil is subjected to surface treatment, in the surface-treated copper foil for a low-dielectric substrate related to the invention, it is preferred that what is called low-profile copper foil be used. This copper foil called the low-profile copper foil is controlled so that the surface roughness value on the matte side becomes a considerably low value. Therefore, by subjecting the matte side to the above-described surface treatment, it is possible to realize the surface-treated copper foil for a low-dielectric substrate related to the invention in which the roughness value Rz of this surface, which becomes a bonded surface, is controlled to 1.0 to 6.5 $\mu$m. This is the reason why the use of low-profile copper foil is recommended.

The surface-treated copper foil for a low-dielectric substrate related to the invention is suitable for a low-dielectric substrate which contains any one kind selected from the group consisting of a liquid-crystal polymer, polyfluoroethylene, an isocyanate compound and a low-dielectric polyimide compound. A low-dielectric substrate formed from these materials has an excellent low dielectric constant and it is possible to realize high peel strength by bonding this low-dielectric substrate to the surface-treated copper foil for a low-dielectric substrate related to the invention. This is because as described above, when the surface-treated copper foil for a low-dielectric substrate related to the invention is bonded to these low-dielectric substrates and the copper foil is peeled, a phenomenon which is what is called the cohesive failure occurs within the resin of the substrate.

BEST MODE FOR CARRYING OUT THE INVENTION

Preferred embodiments of the invention will be described below.

Figure 1:
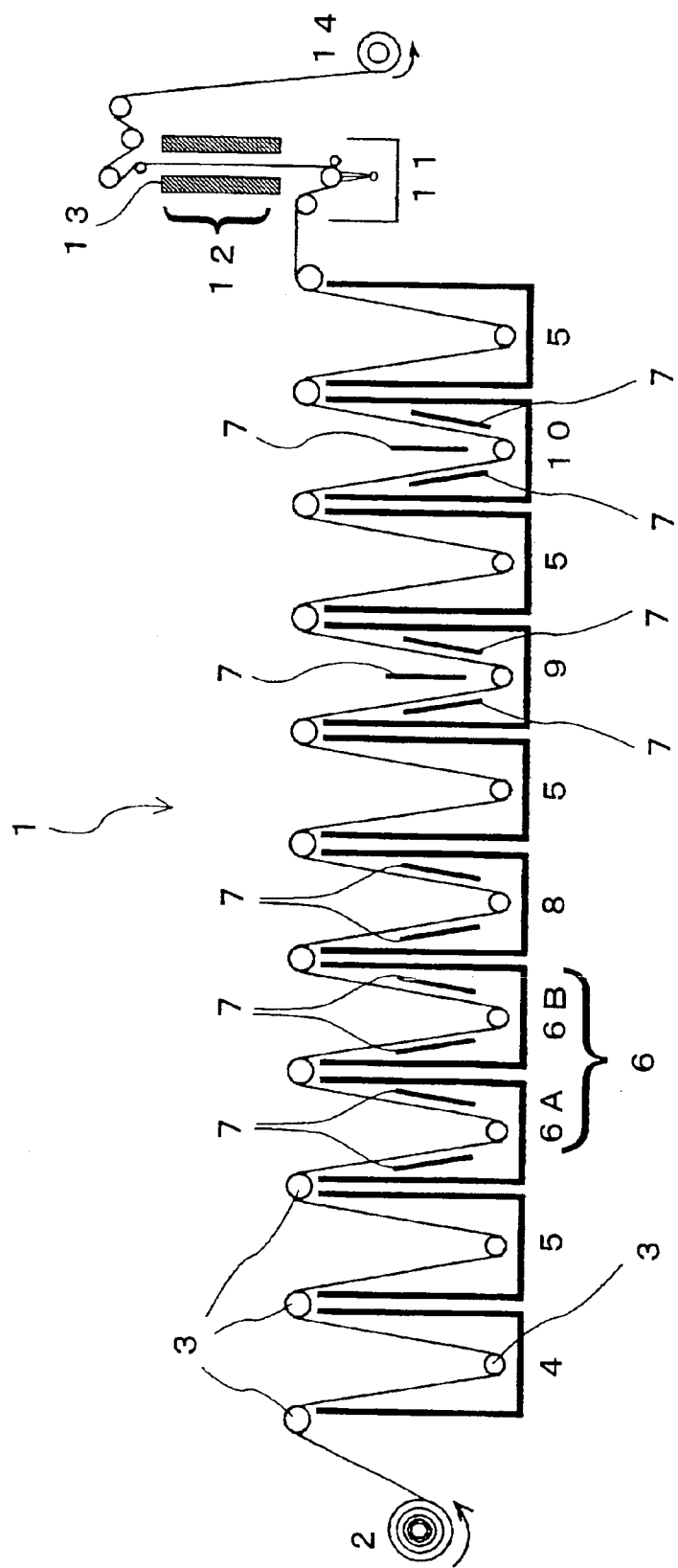
FIG. 1 is a schematic side view of surface treatment equipment.

First Embodiment:

For the surface-treated copper foil for a low-dielectric substrate of the first embodiment, electrodeposited copper foil produced by being wound in roll form by an electrodeposited copper foil manufacturing apparatus provided with a titanium rotary cathode drum dipped in a copper sulfate electrolysis was used as the raw material. This electrodeposited copper foil wound in roll form was subjected to surface treatment by use of the surface treatment equipment shown in FIG. 1 and the surface-treated copper foil for a low-dielectric substrate of this embodiment, which is suitable for a high-frequency printed wiring board, was produced. FIG. 1 shows a schematic side view of the surface treatment equipment 1. This treatment equipment is of such a type that as viewed from the side, electrodeposited copper foil 2 is guided to each treatment tank by means of guide rolls 3 so as to travel while snaking its way. Each section of the surface treatment will be described below on the basis of FIG. 1.

The surface treatment equipment 1 of FIG. 1 winds off the electrodeposited copper foil 2 in roll form (low-profile type electrodeposited copper foil having a nominal thickness of 18 μm and a surface roughness Rz of 3.0 μm) and performs surface treatment while causing the copper foil to pass through each treatment tank via the guide rolls 3 in the following order.

The wound-off electrodeposited copper foil 2 first enters an acid pickling tank 4. The acid pickling tank 4, which is filled with a dilute sulfuric acid solution having a sulfuric acid concentration of 150 g/L and a liquid temperature of 30° C., removes oil and fat components adhering to the electrodeposited copper foil 2 in a dipping time of about 30 seconds and, at the same time, removes surface oxide films, whereby the electrodeposited copper foil 2 is made clean. After leaving the acid pickling tank 4, the electrodeposited copper foil 2 passes through a water-rinse tank 5 and enters a nodular treatment tank 6 in order to form bump-like copper particles on the surface of the matte side of the electrodeposited copper foil 2. The surface treatment performed within the nodular treatment tank 6 comprises the treatment within a treatment tank 6A, which involves causing the copper microparticles to be precipitated on the matte side of the electrodeposited copper foil 2 and adhere thereto, and the treatment within a seal plating tank 6B for preventing the copper microparticles from falling off. The electrodeposited copper foil 2 itself is polarized to a cathode at this time, and within the treatment tanks 6A, 6B flat-plate-like anode electrodes 7 are appropriately disposed parallel to the matte surface of the electrodeposited copper foil.

In the treatment tank 6A for the precipitation and adhering of copper microparticles on the electrodeposited copper foil 2, electrolysis was performed for 10 seconds in a copper sulfate solution under the burn plating conditions: a sulfuric acid concentration of 120 g/L, a copper concentration of 23 g/L, a liquid temperature of 28° C. and a current density of 15 A/dm². In the seal plating tank 6B for preventing the falling-off of the copper microparticles formed in the treatment tank 6A, seal plating was carried out by performing electrolysis for 25 seconds in a copper sulfate solution under the level plating conditions: a sulfuric acid concentration of 160 g/L, a copper concentration of 70 g/L, a liquid temperature of 48° C. and a current density of 18 A/dm². At this time, flat-plate-like anode electrodes 7 were disposed within the treatment tank 6B in the same manner as with the treatment tank 6A.

Subsequently to the step of nodular treatment for forming bump-like copper particles in this manner, ultrafine copper particles were caused to precipitate uniformly on the surfaces of the bump-like copper particles and adhere thereto in a copper sulfate solution under the plating conditions: a sulfuric acid concentration of 80 g/L, a copper concentration of 15 g/L, an α-naphtoquinoline of 120 mg/L, a liquid temperature of 40° C. and current density of 35 A/dm². In a treatment tank for forming ultrafine copper particles 8 shown in FIG. 1, ultrafine copper particles were caused to precipitate on all of the bump-like copper particles and adhere thereto.

Subsequently, nickel-zinc alloy plating was performed in a nickel-zinc passivation tank 9 after the passing through a water-rinse tank 5. Also here, the anode electrode 7 is disposed as shown in FIG. 1. For the plating in this tank, a pyrophosphoric acid bath was used, a Ni concentration of 0.3 g/L and a Zn concentration of 2.5 g/L were maintained, and the plating conditions were a liquid temperature of 40° C., a current density of 10 A/dm² and an electrolysis time of 2 seconds.

Next, in an electrolytic chromate passivation tank 10, a chromate layer was formed by performing electrolysis on a nickel-zinc passivated layer formed in the nickel-zinc passivation tank 9 after passing through a water-rinse tank 5. The electrolysis conditions at this time were a chromic acid concentration of 5.0 g/L, pH 11.5, a liquid temperature of 35° C., a current density of 8 A/dm² an electrolysis time of 5 seconds. Within this treatment tank, the anode electrode 7 is disposed as described above.

Rinsing with water was performed after the completion of the electrolytic chromate passivation, and thereafter in a silane coupling agent treatment tank 11, the adsorption treatment of a silane coupling agent to the surface of the nodular-treated surface was immediately carried out without causing the copper foil surface to be dried. The liquid composition at this time was prepared by adding 5.0 g/L of γ-aminopropyltrimethoxysilane to ion-exchange water as a solvent. The adsorption treatment was carried out by spraying this solution to the copper foil surface by showering.

After the completion of the silane coupling agent treatment, the electrodeposited copper foil 2 was finally treated in a drying section 12, in which the atmosphere temperature was adjusted by an electric heater 13 so that the foil temperature became not less than 100° C., and the electrodeposited copper foil 2 was caused to pass through the heated furnace interior by spending about 4 seconds, whereby the moisture content was removed and the condensation reaction of the silane coupling agent was promoted. The electrodeposited copper foil 2 was wound in roll form as completed surface-treated copper foil 14 (hereinafter referred to as the inventive foil). The travel speed of the electrodeposited copper foil in the above-described steps was 2.0 m/min, and between the steps of each tank the water-rinse tanks 5 capable of rinsing with water for about 15 seconds were provided as required to perform rinse with water, whereby the carrying-over of the solution in the preceding treatment step was prevented.

Furthermore, conventional surface-treated copper foil (hereinafter referred to as the conventional foil) was also produced for comparison. This conventional foil was produced from the same electrodeposited copper foil as with the above-described surface-treated copper foil of this embodiment as the raw material. Although this conventional foil was produced by performing surface treatment also by use of the surface treatment equipment shown in FIG. 1, the manufacturing method was the same as with the above-described surface-treated copper foil of this embodiment, with the exception that the deposition and adhering of ultrafine copper particles after the nodular treatment was not performed (the treatment tank for forming ultrafine copper particles 8 is not provided), that zinc passivation was performed in place of the nickel-zinc passivation, and that epoxy silane was used as the silane coupling agent (however, the solution concentration and application conditions were the same). Therefore, the description of the manufacturing method is omitted. For the plating for this zinc passivation, a zinc pyrophosphate bath was used, a Zn concentration of 5.0 g/L was maintained, and the plating conditions were a liquid temperature of 40° C., a current density of 10 A/dm$^2$ and an electrolysis time of 2 seconds.

Table 1 shows results of the measurement of the roughness of the bonded surface (Rz) and surface passivation amount of the inventive foil A and conventional foil.

TABLE 1

| | Bonded surface | | | |
|---|---|---|---|---|
| | Roughness ($\mu$m) | Amount of Zn | Amount of Ni | Amount of Cr |
| Inventive foil A | 4.3 | 20 | 2.5 | 2.0 |
| Conventional foil | 4.3 | 21 | — | 2.3 |

(Unit of amounts of Zn, Ni and Cr: mg/m$^2$)

A copper-clad laminate was produced each from the inventive foil A and conventional foil shown in Table 1 by using a prepreg of thermoset PPO (polyphenylene oxide) resin substrate as a low-dielectric substrate for high-frequency applications, and the peel strength at the adhesive interface between the copper foil and the substrate was measured. This peel strength measurement was carried out by forming a 0.8 mm-wide circuit after the formation of each copper-clad laminate and by peeling off the circuit (in accordance with IPC-TM-650 2.4.8.5). As a result, it became apparent that the peel strength of the inventive foil A is 0.89 kN/m on average and that of the conventional foil is 0.28 kN/m. When the surfaces of the copper foil and substrate after this peel test were observed, it was ascertained that in the inventive foil, what is called an cohesive failure had occurred within the resin of the substrate. On the other hand, in the conventional foil, peeling had occurred at the interface between the copper foil and the substrate, that is, an interfacial failure had occurred.

Also, copper foil having a nominal thickness of 12 $\mu$m (surface roughness Rz: 3.5 $\mu$m) and copper foil having a nominal thickness of 35 $\mu$m (surface roughness Rz: 4.6 $\mu$m) as the electrodeposited copper foil 2 were subjected to the same treatment as with the above-described inventive foil, a substrate of thermoset PPO (polyphenylene oxide) resin substrate and a copper-clad laminate were formed, and the peel strength was measured. As a result, it became apparent that the peel strength of the inventive foil is 0.72 kN/m for the thickness of 12 $\mu$m and 1.00 kN/m for the thickness of 35 $\mu$m.

Next, a description will be given below of the result of the investigation into the effect of the surface treatment by ultrafine copper particles on transmission losses. A 5 cm-long strip line which was adjusted so that the characteristic impedance became 50 $\Omega$ was formed, a signal was input from one side of this strip line, the signal output from the other side was detected and the transmission losses were evaluated from the attenuation rate of the signal. As a result, at both 1 GHz and 3 GHz there was no great difference between the inventive foil and the conventional foil and it was judged that ultrafine copper particles have no effect on transmission losses.

Figure 2:
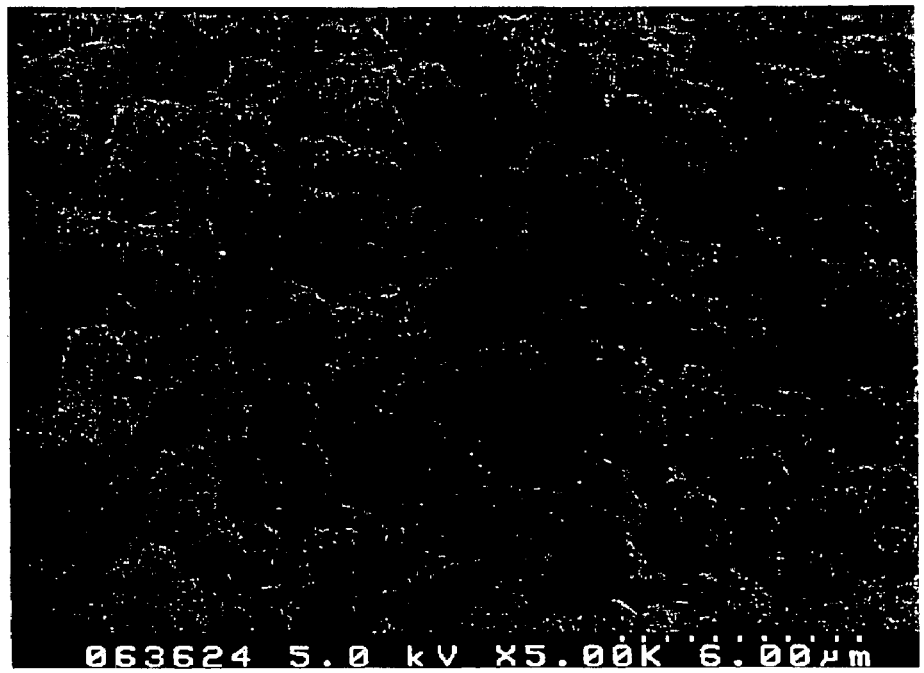
FIG. 2 is a photograph of an observational image of a bonded surface of foil according to the invention obtained by a surface observation under a scanning electron microscope.
Figure 3:
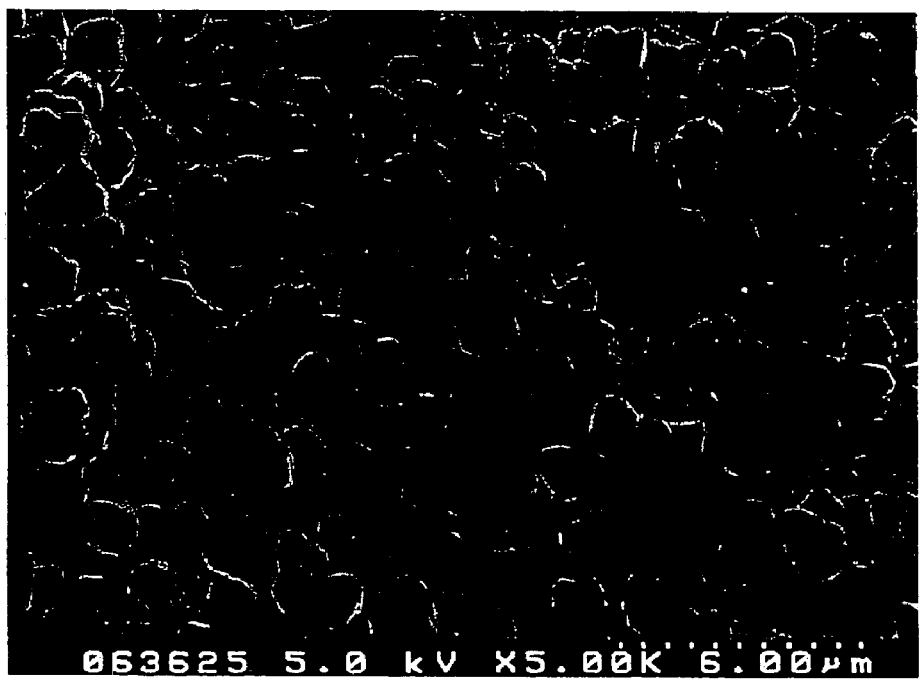
FIG. 3 is a photograph of an observational image of a bonded surface of conventional foil obtained by a surface observation under a scanning electron microscope.

Subsequently, a description will be given of the result of an observation of the bonded surface of the inventive foil and the conventional foil under a scanning electron microscope (SEM, magnification: 5000 times). FIG. 2 shows the inventive foil and FIG. 3 shows the conventional foil. As is apparent from a comparison between FIGS. 2 and 3, it was ascertained that in the inventive foil, ultrafine copper particles are caused to uniformly precipitate on the surfaces of the bump-like copper particles and adhere thereto.

Second Embodiment:

In the second embodiment, a description will be given of the result of an investigation into the adhesion of the passivated layer of the bonded surface and a low-dielectric substrate.

The surface-treated copper foil for a low-dielectric substrate used in the second embodiment was produced by the same method as described in the above-described first embodiment. However, the current density in the nickel-zinc passivation tank 9 in the surface treatment equipment 1 of FIG. 1 was changed in order to control the deposited amounts of nickel and zinc of the passivated layer, (other conditions being the same). As a result, surface-treated foil for a low-dielectric substrate having different deposited amounts of nickel and zinc was obtained. The electrodeposited copper foil used in this embodiment was low-profile copper foil having a nominal thickness of 18 $\mu$m (surface roughness Rz: 3.0 $\mu$m). Table 2 shows the passivated layer compositions of each surface-treated copper foil produced in the second embodiment.

TABLE 2

| | Roughness (μm) | Treatment to form ultrafine copper particles | Amount of Zn (mg/m²) | Amount of Ni (mg/m²) | Amount of Cr (mg/m²) | Silane coupling treatment |
|---|---|---|---|---|---|---|
| | | | Bonded surface | | | |
| Inventive foil B | 4.3 | With | 13 | 25 | 3.1 | Amino silane |
| Comparative Example B1 | 4.3 | With | 26 | 22 | 3.7 | Amino silane |
| Comparative Example B2 | 4.3 | With | 30 | 0 | 2.4 | Amino silane |
| Comparative Example B3 | 4.1 | Without | 13 | 25 | 3.3 | Amino silane |
| Comparative Example B4 | 4.3 | With | 13 | 23 | 3.1 | Epoxy silane |

Amino silane: γ-aminopropyltrimethoxysilane
Epoxy silane: γ-glycidoxypropyltrimethoxysilane As shown in Table 2, the inventive foil B was produced as the surface-treated copper foil for a low-dielectric substrate related to the invention. Furthermore, for comparison, foil in which the composition ratios of nickel and zinc are changed, foil which is not subjected to the treatment to form ultrafine copper particles, and foil in which an epoxy silane coupling agent is used (the solution concentration and application conditions being the same as with the first embodiment) were produced as the surface-treated copper foils of the comparative foil B1 to B4.

Copper-clad laminates were produced from each surface-treated copper foil shown in Table 2 by using a prepreg of a low-dielectric substrate for high-frequency applications (a thermoset PPO resin substrate) similar to that of the first embodiment. The peel strength (in a normal state) at the adhesive interface between the copper foil and the substrate was measured (in accordance with IPC-TM-650 2.4.8.5) by use of samples of these copper-clad laminates, and the deterioration rate of humidity resistance after PCT and the solder heat resistance after PCT were investigated. PCT stands for the pressure cooker test. The deterioration rate of humidity resistance after PCT is obtained by forming a 0.8 mm-wide circuit for each copper-clad laminate, allowing the samples of the copper-clad laminates to stand for 2 hours in an atmosphere of 100% RH at 121° C. and at 2 atmospheric pressures, measuring the peel strength after drying, and examining to what percentages the value has deteriorated from the normal state peel strength. The solder heat resistance after PCT is obtained by preparing a sample with a 5 cm-square for each copper-clad laminate, allowing the samples to stand for 2 hours in an atmosphere of 100% RH at 121° C. and at 2 atmospheric pressures, floating the samples for 20 seconds in a solder bath at 246° C. after drying, and thereafter visually observing the condition of adhesion between the copper foil and the substrate. Table 3 shows the results of the measurement.

TABLE 3

| | Peel strength (width: 0.8 mm) | | |
|---|---|---|---|
| | Normal state (kN/m) | Deterioration rate of humidity resistance after PCT (%) | Solder heat resistance after PCT |
| Inventive foil B | 1.22 | 14 | No abnormality |
| Comparative foil B1 | 1.23 | 29 | No abnormality |
| Comparative foil B2 | 1.23 | 61 | Occurrence of delamination |
| Comparative foil B3 | 1.18 | 43 | Occurrence of delamination |
| Comparative foil B4 | 1.19 | 60 | Occurrence of delamination |

As shown in Table 3, it became apparent that the inventive foil B is at levels which pose no practical problems in any of the normal state peel strength, the deterioration rate of humidity resistance after PCT and the solder heat resistance after PCT. On the other hand, in the case of the comparative foil B1 in which the deposited amounts of nickel and zinc were changed (the nickel to zinc ratio deviating from the range of 6:4 to 8:2), the deterioration rate of humidity resistance after PCT showed a tendency to become worse a little. In the case of the comparative foil B2 in which a passivated layer containing only zinc and not containing nickel at all was formed, the deterioration rate of humidity resistance after PCT worsened exceedingly and in the investigation of the solder heat resistance after PCT, the occurrence of delamination, which demonstrates the peeling of the copper foil from the substrate, was ascertained. Also in the case of the comparative foil B3 which was not subjected to treatment to form ultrafine copper particles and the comparative foil B4 in which an epoxy silane coupling agent was used, the deterioration rate of humidity resistance after PCT worsened exceedingly and the solder heat resistance after PCT also showed bad results.

INDUSTRIAL APPLICABILITY

As described above, according to the surface-treated copper foil for a low-dielectric substrate related to the invention, it is possible to positively bond the copper foil to a substrate even when the substrate is a low-dielectric substrate for high-frequency applications which is considered to have low adhesive strength and it is possible t maintain high adhesive strength. Furthermore, it is possible to maintain excellent adhesive strength even under severe humidifying conditions. And it is possible to manufacture copper-clad laminates and printed wiring boards suitable for high-frequency applications with small transmission losses.

What is claimed is:

1. A surface-treated copper foil suitable for use with a low-dielectric substrate, comprising a nodular-treated layer constituted by bump-like copper particles on a surface of the copper foil and a layer of precipitated ultrafine copper particles adhered to the entire surface of the nodular-treated layer, the roughness value Rz of the resulting surface being 1.0 to 6.5 μmm, wherein the ultrafine copper particles have a particle size of 0.1 to 1.0 μm.

2. The surface-treated copper foil according to claim 1, wherein the surface color of the surface-treated copper foil on the side having the nodular-treated layer and the layer of precipitated ultrafine copper particles has L* of not more than 50, a* of not more than 20 and b* of not more than 15.

3. The surface-treated copper foil according to claim 1, further comprising a passivated layer containing at least one metal selected from the group consisting of zinc and nickel on the surfaces of the ultrafine copper particles.

4. The surface-treated copper foil according to claim 3, wherein the passivated layer is formed from zinc and nickel and the total deposited amount of zinc and nickel is 20 to 60 mg/m².

5. The surface-treated copper foil according to claim 4, wherein the passivated layer contains nickel and zinc at a ratio of nickel to zinc in the range of 6:4 to 8:2.

6. The surface-treated copper foil for a low-dielectric substrate according to claim 3, further comprising a chromate layer on the passivated layer and a silane coupling agent adsorbed on the surface of the chromate layer to form a silane coupling-agent layer.

7. The surface-treated copper foil for a low-dielectric substrate according to claim 1, wherein the copper foil is formed by causing copper to precipitate on a cathode by the electrolysis of copper and wherein the copper foil surface on the cathode side of the copper foil is subjected to the surface treatment upon peeling of the copper foil from the cathode.

8. The surface-treated copper foil according to claim 1, wherein the copper foil is formed by causing copper to precipitate on a cathode by the electrolysis of copper and wherein the copper foil finishing side surface which is opposite to the cathode, is subjected to surface treatment upon peeling of the copper foil from the cathode.

9. A copper-clad laminate in which the surface-treated copper foil according to claim 1 is bonded to a low-dielectric substrate.

10. The copper-clad laminate according to claim 9, wherein the low-dielectric substrate contains any one member selected from the group consisting of a liquid-crystal polymer, polyfluoroethylene, an isocyanate compound and a low-dielectric polyimide compound.

11. A printed wiring board which is formed from the copper-clad laminate according to claim 9.

12. A surface-treated copper foil suitable for use with a low-dielectric substrate comprising a nodular-treated layer constituted by bump-like copper particles on a surface of the copper foil and precipitated ultrafine copper particles adhered to the entire surface of the nodular-treated layer, the roughness value Rz of the resulting surface being 1.0 to 6.5 μm, wherein the surface color of the surface-treated copper foil on the side having the nodular-treated layer and the precipitated ultrafine copper particles has L* of not more than 50, a* of not more than 20 and b* of not more than 15, and wherein a passivated layer containing zinc and nickel at a ratio of nickel to zinc in the range of 6:4 to 8:2 is provided on the surface of the precipitated ultrafine copper particles, and wherein the total deposited amount of nickel and zinc is 20 to 60 mg/m².

13. A copper-clad laminate comprising a copper foil of claim 12.

14. A printed wiring board comprising the copper clad laminate of claim 3.

15. A surface-treated copper foil suitable for use with a low-dielectric substrate, comprising a nodular-treated layer constituted by bump-like copper particles on a surface of the copper foil and precipitated ultrafine copper particles adhered to the entire surface of the nodular-treated layer, the roughness value Rz of the resulting surface being 1.0 to 6.5 μm, wherein the surface color of the surface-treated copper foil on the side having the nodular-treated layer and the precipitated ultrafine copper particles has L* of not more than 50, a* of not more than 20 and b* of not more than 15.

16. The surface treated copper foil according to claim 15, wherein a passivited layer containing zinc and nickel is provided on the surface of the precipitated ultrafine copper particles, and wherein the total deposited amount of zinc and nickel is 20 to 60 mg/m².

17. The surface-treated copper foil according to claim 16, wherein the passivated layer contains nickel and zinc at a ratio of nickel to zinc in the range of 6:4 to 8:2.

* * * * *